United States Patent
Bhatt et al.

(10) Patent No.: US 6,418,616 B2
(45) Date of Patent: *Jul. 16, 2002

(54) FULL ADDITIVE PROCESS WITH FILLED PLATED THROUGH HOLES

(75) Inventors: Anilkumar C. Bhatt, Johnson City; Voya R. Markovich, Endwell; Irving Memis, Vestal; William E. Wilson, Waverly, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/795,852

(22) Filed: Feb. 28, 2001

Related U.S. Application Data

(62) Division of application No. 09/047,984, filed on Mar. 25, 1998, now Pat. No. 6,195,883.

(51) Int. Cl.$^7$ ................................................ H01K 3/10
(52) U.S. Cl. .............................. 29/852; 29/830; 29/846; 174/266; 174/262; 427/97; 156/89.18
(58) Field of Search ......................... 29/852, 830, 840, 29/846; 174/263, 262, 266, 250; 156/89.18; 427/97

(56) References Cited

U.S. PATENT DOCUMENTS

| | | |
|---|---|---|
| 4,601,916 A | 7/1986 | Arachtingi |
| 4,915,795 A | 4/1990 | McKeil, Jr. et al. |
| 4,927,983 A | 5/1990 | Jones et al. |
| 4,964,948 A | 10/1990 | Reed |
| 4,967,314 A | 10/1990 | Higgins, III |
| 5,097,593 A | 3/1992 | Jones et al. |
| 5,117,069 A | 5/1992 | Higgins, III |
| 5,140,745 A | 8/1992 | McKenzie, Jr. |
| 5,243,142 A | 9/1993 | Ishikawa et al. |
| 5,275,330 A | 1/1994 | Isaacs et al. |
| 5,421,083 A | 6/1995 | Suppelsa et al. |
| 5,435,480 A | 7/1995 | Hart et al. |
| 5,450,290 A | 9/1995 | Boyko et al. |
| 5,479,703 A | 1/1996 | Desai et al. |
| 5,487,218 A | 1/1996 | Bhatt et al. |
| 5,557,844 A | 9/1996 | Bhatt et al. |
| 5,571,593 A | 11/1996 | Arldt et al. |
| 2001/0007289 A1 * | 7/2001 | Bhatt et al. .................. 174/262 |

FOREIGN PATENT DOCUMENTS

| | | |
|---|---|---|
| WO | WO 95/12643 | 5/1995 |

OTHER PUBLICATIONS

IBM Technical Data Bulletin Oct. 1993, vol. 36, No. 10, p. 511.

IBM Technical Data Bulletin Dec. 1968, vol. 11, No. 7, p. 733.

* cited by examiner

Primary Examiner—Peter Vo
Assistant Examiner—Minh Trinh
(74) Attorney, Agent, or Firm—William N. Hogg

(57) ABSTRACT

A method provides for additive plating on a subcomposite having filled plated through holes. Fine-line circuitry is achieved via electroless deposition onto a dielectric substrate after the through hole is plated and filled. Fine-line circuitry may be routed over landless, plated through holes thereby increasing the aspect ratio and the available surface area for additional components and wiring.

5 Claims, 3 Drawing Sheets

FULL ADDITIVE PROCESS WITH FILLED PLATED THROUGH HOLES

RELATED APPLICATIONS

This application is a divisional of application Ser. No. 09/047,984, filed Mar. 25, 1998, now U.S. Pat. No. 6,195,883.

This application is related to patent application Ser. No. 08/154,341 filed on Nov. 17, 1993, entitled: "Via Fill Compositions for Direct Attach of Devices and Methods for Applying Same", and Divisional application Ser. No. 08/467,938 filed on Jun. 6, 1995, and Divisional application Ser. No. 08/960,770 filed on Oct. 30, 1997, and Divisional application Ser. No. 08/469,449, filed on Jun. 6, 1995, and Divisional application Ser. No. 08/467,558 filed on Jun. 6, 1995, which issued as U.S. Pat. No. 5,571,593 on Nov. 5, 1996.

BACKGROUND

1. Field of the Invention

This invention relates to a method of producing fine-line circuitry on the surface of a printed circuit board having plated through holes. Specifically, full additive process of circuitization is employed to produce a printed circuit board having fine-line circuitry and increased density. This invention also relates to the resulting printed circuit board and its use in surface laminar circuit technology to form composite structures.

2. Description of Related Art

A conventional process for producing printed circuit boards used in composite structures is as follows: A pattern of holes is drilled through a dielectric substrate or panel. The substrate panel surface and the surfaces created by the holes of the drilled substrate are seeded with a palladium/tin colloidal suspension to catalyze the surfaces for electroless copper plating. Next, the dielectric substrate is copper plated, via electroless or electrolytic deposition, onto the panel surfaces and onto the surfaces created by the through holes at a thickness of approximately 1 mil to about 1.5 mils to form a subcomposite. A minimum thickness copper is required to prevent stress cracking in the through holes. This minimum thickness of copper plating of about 1 mil is often thicker than the desired thickness of the circuitry to be formed on the panel surface, and thus, the subcomposite may be partially etched to reduce the copper thickness on the panel surfaces to about 0.5 mil. Next, the plated through holes are then filled with a compound that can be either conductive or nonconductive. Typically, a layer of negative-acting photoresist is applied to the subcomposite and the photoresist is exposed and developed to define a desired pattern of surface circuitization. The revealed portion of the of copper is then etched away, and finally, the photoresist is stripped to reveal the desired pattern of circuitry.

The subtractive etch method of circuitization, described above, yields a subcomposite having limited wiring density. When conductive metal is etched to form spaces between lines of circuitry, the conductive metal which is covered by photoresist during formation of circuitry, is susceptible to erosion by the etchant in areas beneath the photoresist. To avoid this problem, the thickness of the circuit lines divided by the width of the spaces between them, i.e. the aspect ratio, must be sufficiently low to produce a functional product. The width of spaces limits wiring density, For example, a typical circuit board that has circuit lines about 1 mil thick, requires line and space widths of at least about 3 mils. Also, sharp edge definition, such as the formation of squared lines, is difficult to achieve using the subtractive etch method.

Accordingly, the need exists for a printed circuit board and method of making printed circuit boards, having higher aspect ratio and fine-line circuitry definition on subcomposites with filled plated through holes.

SUMMARY OF THE INVENTION

The present invention provides a printed circuit board and a method for the production of a printed circuit board having fine-line circuitry and greater aspect ratio on a subcomposite with plated through holes. The invention herein yields a printed circuit board that has increased wiring and component density. As an additional benefit, the invention herein also provides a printed circuit board and a method of producing a circuit board having landless, plated through holes, and provides yet additional opportunity for increased wiring and component density.

In accordance with the method, a printed circuit board is produced by first drilling a pattern of holes in the dielectric substrate. Next, the substrate undergoes full panel plating, preferably electroless plating, of a layer of conductive metal on the substrate, including the surfaces formed by the holes, at a thickness of approximately 1.0 mil to 2.0 mils to form a subcomposite. The plated holes are then filled with conductive or nonconductive compound, and any compound residue which remains on the surface of the circuit board is removed, preferably by mechanical-chemical scrubbing. The conductive metal layer on the surface of the subcomposite is partially etched to a fraction of its thickness. Next, the nubs of filler compound that protrude from the filled plated through holes are gradually removed, by pumice scrub for example. The subcomposite having conductive-metal plate is etched a second time to completely remove the metal. The remaining nubs of fill compound are chemically polished, preferably, such that a layer of plating will properly adhere to the subcomposite. The resulting subcomposite is a dielectric having filled plated through holes.

Next, the subcomposite is seeded via immersion plating, preferably with palladium/tin, to catalytically activate the surface of the dielectric. A photoresist coating, preferably negative-acting photoresist, is applied to the substrate. The photoresist is exposed and developed to create a fine-line pattern for circuitization. A layer of conductive metal is plated, preferably via electroless plating, on the areas of the subcomposite which are not covered by the photoresist. The photoresist and the seed layer are stripped to reveal the pattern of circuitization which connects the plated through holes. Also, a portion of the circuitry runs through any pads that are present and covering the plated through holes.

BRIEF DESCRIPTION OF DRAWINGS

The present invention may be more readily understood by reference to the following drawings wherein.

DETAILED DESCRIPTION OF THE INVENTION

Figure 1A:
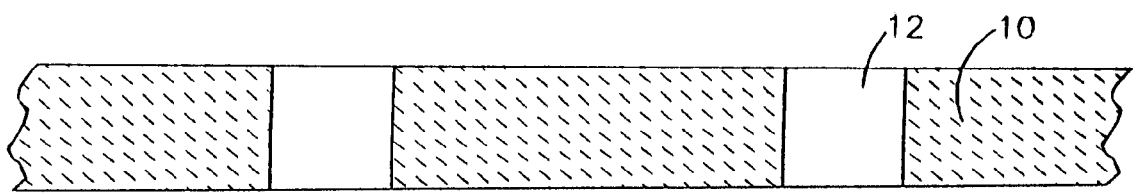
FIG. 1(a) is a cross-sectional view of a dielectric substrate having through holes.

The method of this invention provides for full additive plating of fine-line circuitry on a printed circuit board having filled plated through holes. Fine-line circuitry means lines that have an aspect ratio greater than about 0.5 and preferably greater than about 1, wherein the aspect ratio is defined as the thickness of the circuit lines divided by the width of the spaces between the lines. That is, circuit lines are preferably about 1 mil or thicker and are separated by narrow spaces, that is, space widths as low as about 1 mil or lower based on the minimum widths that can be created by the photoresist coating. Referring to the drawings and initially to FIG. 1(a), there is illustrated a dielectric substrate 10 having a plurality of through holes 12 drilled throughout the substrate for connections to be made between the opposite sides of the substrate, the connections being well known in the art. FIG. 1(b) shows a layer of electrically-conductive metal 14, preferably copper foil, laminated on the panel surfaces of dielectric 10 before through holes 12 are drilled to form subcomposite 16, and prior to additive plating. This lamination method may be used, for example, when better mechanical adhesion of electrically conductive metal to the dielectric is desired.

The dielectric substrate is preferably made of epoxy glass, commonly known as FR-4 made by, for example Ceiba-Geigy Company, under the trademark Dryclad®. An exemplary list of suitable substrates includes ceramics, glass-filled ceramics, glasses and polymers. Exemplary polymeric materials useful to practice the present invention are polyamides, polyamide-imides, polyolfins, such as polyethylene, polypropylene, polybutadiene, polysulfones, polycarbonates, polyethylene, terephthalates, polyisophthalimides, polyacrylates, polyacrylonitriles, polystyrene, polyesters, polysiloxanes, nitrile, ABS polymers, fluoropolymers, thermosetting polymers such as epoxy and pH-based materials.

Figure 1B:
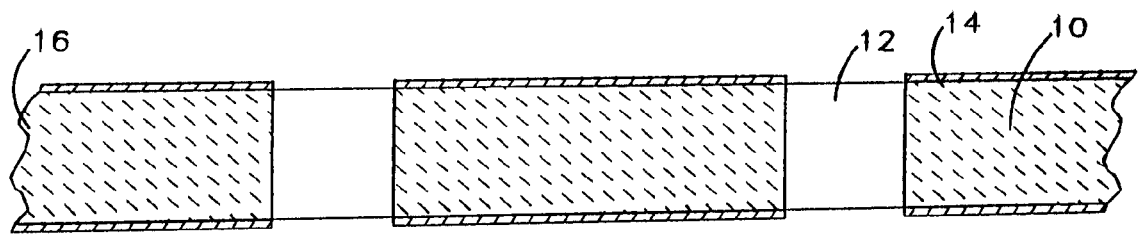
FIG. 1(b) is a cross-sectional view of a subcomposite having plating on the panel surface of the dielectric substrate.
Figure 2:
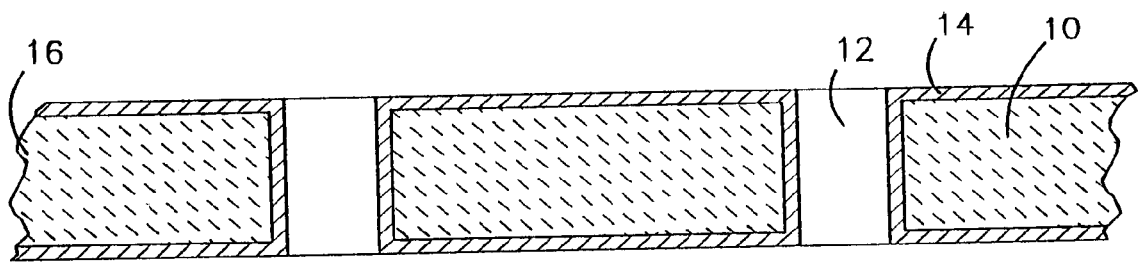
FIG. 2 is a cross-sectional view of a subcomposite with full panel plating on the surfaces including the inner surfaces of the drilled through holes.
Figure 3:
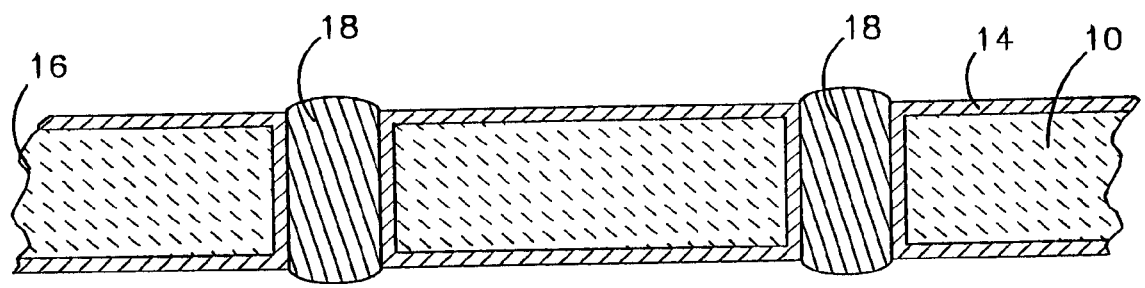
FIG. 3 is a cross-sectional view of a subcomposite having filled through holes.

Next, either dielectric substrate 10 of FIG. 1(a) or subcomposite 16 of FIG. 1(b) undergoes plating initiation via deposition of a seed layer (not shown) in a well-known manner. FIG. 2 shows a layer of electrically conductive metal 14, preferably copper, plated on the panel surfaces and on surfaces created by the through holes 12 to form subcomposite 16. The electrically conductive metal is plated to a thickness of at least about 0.1 mil, preferably about 0.1 mil to about 4 mils, and most preferably about 0.2 mil to about 2.0 mils. Next, the plated through holes are filled with fill compound 18 of FIG. 3. The filler is preferably a composition of an organic polymer material, optionally with a particulate additive to modify the thermal or electrical conductivity or the coefficient of thermal expansion. Preferably, the fill composition is a thermosetting epoxy resin of the same type used to make epoxy/glass subcomposites, and is filled with metallic particulates such as silver or copper particles, for example. The process for selectively mass filling the plated through holes as well as details regarding the fill compound as described in U.S. Pat. No. 5,487,218 and is hereby incorporated by reference herein.

An important facet of the invention herein is the process for preparing the subcomposite for full additive circuitization. As a general overview of the process, conductive metal 14 must be removed down to dielectric substrate 10 prior to the additive plating of circuitry. The conductive metal is removed gradually, however, and a minimum thickness of conductive metal 14 remains until the process for removing the residual nubs of the cured fill compound 18 is nearly complete. This is because the process for removing nubs of fill compound is harmful to substrate 10 and its receptivity to additive plating.

Figure 4:
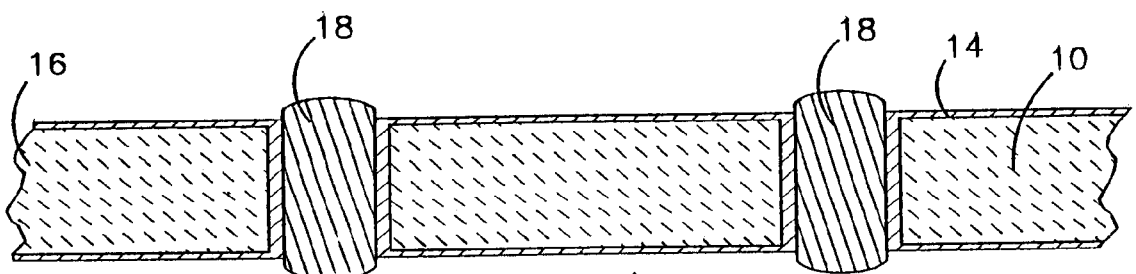
FIG. 4 is a cross-sectional view of a subcomposite after partial etching of the conductive metal layer.

Once the plated through holes have been filled, the fill compound residue is removed, preferably using a mechanical-chemical polish tool as described in U.S. patent application Ser. No. 08\704,193 filed on Aug. 26, 1996 and Continuation-In-Part application Ser. No. 08\758,272 filed on Nov. 19, 1996, and are hereby incorporated by reference herein. Next, the electrically conductive layer of metal is partially etched such that the layer of conductive metal 14 of FIG. 4 is preferably between about 0.2 mil to about 0.3 mil thick. The fluid-head etch process well known in the art, and specifically, the preferred method and apparatus for fluid-head etch is described in U.S. Pat. No. 5,435,885 and is hereby incorporated by reference herein. A suitable etching solution is cupric chloride and is well known in the art. Cupric chloride etching solution is preferably applied at a temperature of about 80° C. for about 5 minutes based upon approximately 1 mil thickness of conductive metal 14, for example. Other examples of suitable etching solutions include sodium persulfate and ferric chloride.

Figure 5:
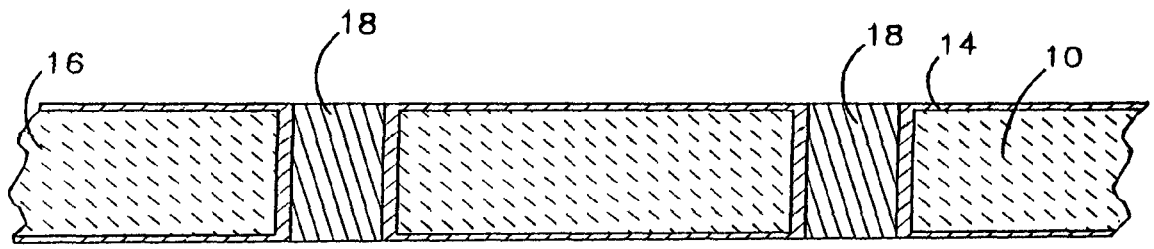
FIG. 5 is a cross-sectional view of a subcomposite after scrubbing to remove the nubs of excess fill compound.
Figure 6:
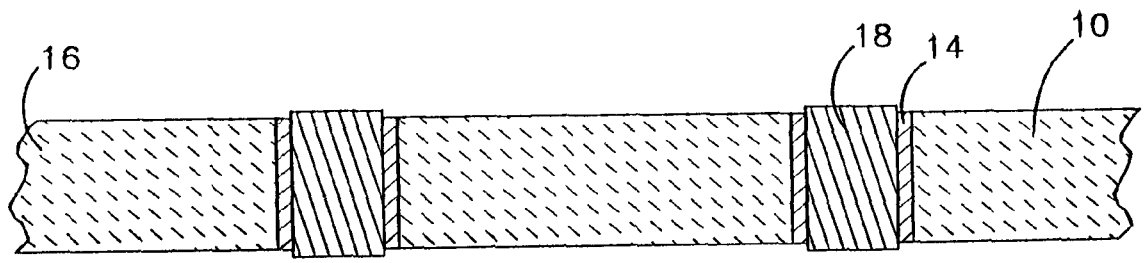
FIG. 6 is a cross-sectional view of a subcomposite after etching away the conductive metal layer completely, thereby revealing the dielectric substrate.
Figure 7:
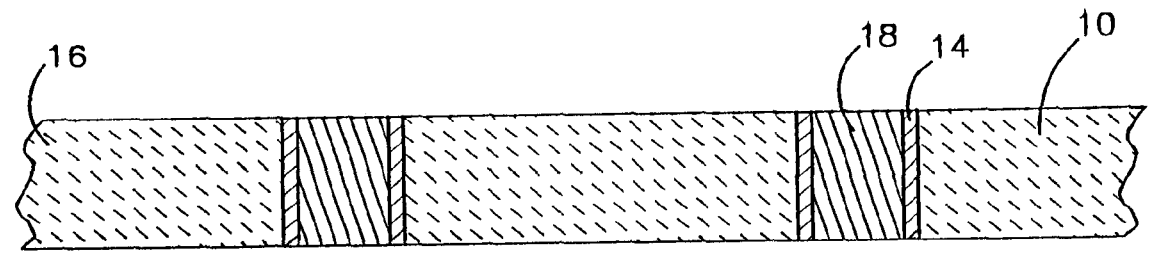
FIG. 7 is a cross-sectional view of a dielectric subcomposite after polishing remaining nubs of the fill compound.

Following the partial etch process, the residual nubs of fill compound 18 which protrude beyond the surfaces of subcomposite 16 of FIG. 4, are removed preferably by mechanical/chemical processes, for example pumice scrubbing, until such surfaces are smooth as shown in FIG. 5. Next, the remaining layer of conductive metal 14 is completely etched off the surface of subcomposite 16 of FIG. 6, by the same etching process described above. Any remaining fill compound 18 protruding out of the plated through holes is chemically polished, preferably using a mechanical-chemical polish tool described above, to obtain a yet smoother subcomposite surface at the sites of the filled plated through holes. FIG. 7 shows the resulting subcomposite 16, having filled plated through holes in preparation of additive plating.

Figure 8:
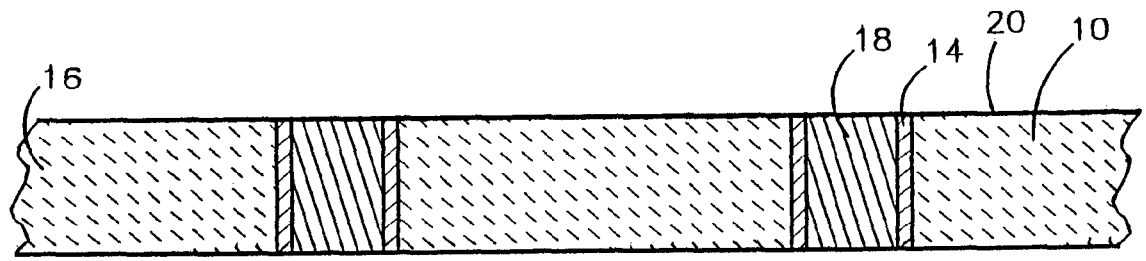
FIG. 8 is a cross-sectional view of the dielectric subcomposite having filled plated through holes with a full panel seed layer deposited thereon.

Seed activator 20 (see FIG. 8) is applied to the entire surface of subcomposite 16, at a thickness of about 50 to about 100 Angstroms via immersion of the subcomposite in a colloidal suspension, the process being well known in the art. The seed activator catalytically activates dielectric substrate 10 for additive plating, for example, electroless plating. Palladium is the preferred seed activator, and an exemplary list of other suitable materials includes nickel, silver, platinum, copper and combinations thereof.

Figure 9:
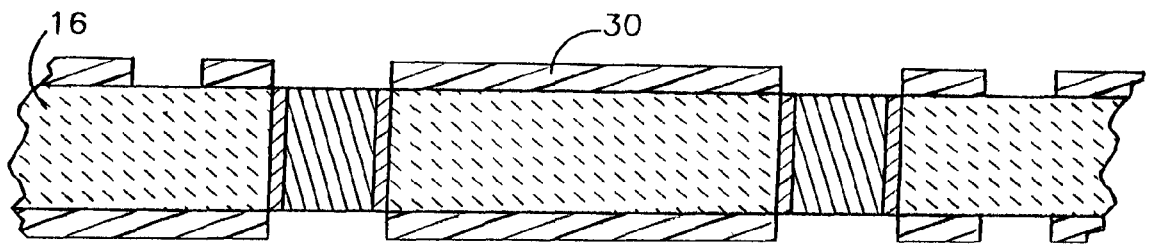
FIG. 9 is a cross-sectional view of the dielectric subcomposite subsequent to the application, exposure and development of a photoresist layer to produce a photoimaged and developed pattern for circuitization.

FIG. 9 shows photoresist coating 30 applied to the surface of subcomposite 16. The photoresist coating is exposed to acetonic radiation in the desired pattern and chemically developed to reveal a pattern for circuitization on the selected surfaces of the subcomposite including the surfaces of the filled plated through holes. An example of a photoresist suitable for use in an alkaline electroless bath, for example, is Riston T168 from DuPont de Nemours and Company. Any one of a variety of commercially available developers may be utilized to develop the photoresist. An example of a developer suitable for use with the solvent-type photoresist is patented propylene carbonate solution (commonly assigned U.S. Pat. No. 5,268,260). The propylene carbonate developer of this type is applied at approximately 50° C. for about between five to ten minutes.

Figure 10:
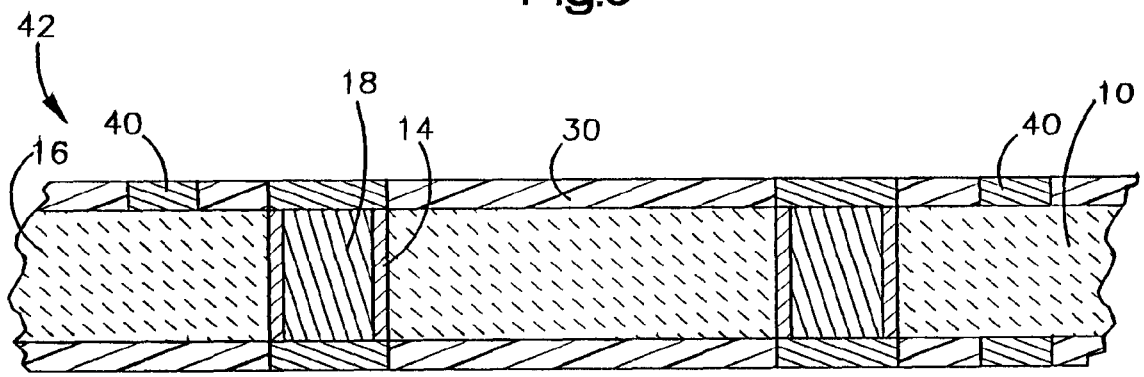
FIG. 10 is a cross-sectional view of the dielectric subcomposite subsequent to additive plating of a conductive layer of metal on the portion of the panel surfaces not covered by photoresist, thereby resulting in a printed circuit board.

Next, fine-line circuitry is created preferably by electroless deposition. FIG. 10 shows the portions of subcomposite 16 created by the pattern of photoresist 30 is plated with a layer of conductive metal 40 thereby resulting in printed circuit board 42. Conductive metal 40, preferably copper, is plated to 0.1 mil or greater, preferably about 0.1 mil to about 4 mils, and most preferably about 0.2 mil to about 2.0 mils thick. Printed circuit board 42 has an aspect ratio preferably greater than about 0.5 and more preferably greater than about 1.

Figure 11:
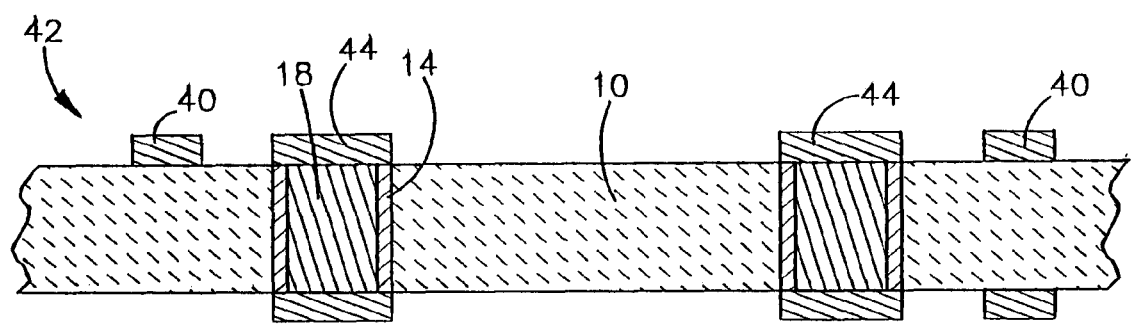
FIG. 11 is a cross-sectional view of the printed circuit board with the photoresist removed and the seed stripped away.

FIG. 11 shows the printed circuit board with the photoresist stripped away. Propylene carbonate, described above, is also preferably used as the stripping solution. For stripping, the solution is applied at about 100° C. for about ten minutes.

Additive plating also produces pads 44 with the diameter of the pads now capable of being approximately equal to the diameter of the landless, plated through holes. In conventional methods, using for example the subtractive etch method of circuitization, the plating process is completed before the through holes are filled with compound. Thus, in conventional methods there is no layer of conductive metal plated over the filled through hole, which requires that a land of metal be made during the circuitization process to allow a solderable connection. The additive plating method of the present invention eliminates the need for lands on the subcomposite around the plated through holes. Thus, as an added benefit of the invention herein, a larger surface area is available for both increased component density and increased wiring density.

Figure 12:
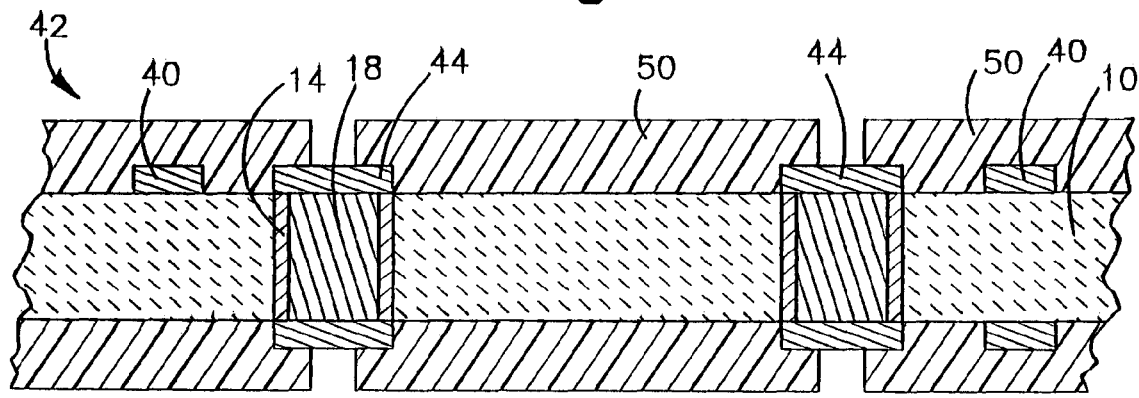
FIG. 12 is a cross-sectional view of the printed circuit board with a photosensitive dielectric material having vias placed thereon, prior to the formation of Surface Laminar Circuitry (SLC).

Once the fine-line circuitization process as described above is complete, the process for forming a Surface Laminar Circuit (SLC) on either or both sides of the subcomposite is employed using a well-known method. The method for forming a printed circuit board having a surface laminar surface is fully described in U.S. Pat. No. 5,097,593 and is hereby incorporated by reference herein. FIG. 12 shows printed circuit board 42 with the addition of photosensitive dielectric material 50. Additional circuitry (not shown) may be formed on the surface of photosensitive dielectric 50 to produce a printed circuit board having a Surface Laminar Circuit on top of subcomposite 16. In such a case, vias are formed through photosensitive dielectric 50 such that the circuit lines (not shown) on the photosensitive dielectric communicate with circuitry 40 and component pad 44 of subcomposite 16.

Although the invention has been shown and described with respect to a specific embodiment, alternate equivalent modifications are possible the present invention includes all such equivalent alterations and modifications, and is limited only by the scope of the following claims.

What is claimed is:

1. A method of producing fine-line circuitry on a printed circuit board having a planar surface and at least one filled plated through hole, said method comprising the steps of:

(a) drilling at least one hole through a dielectric substrate, said hole defining a surface;

(b) depositing a seed layer on the planar surface of said dielectric substrate and on said surface defined by said hole;

(c) depositing electrically conductive plating on said planar surface of said dielectric substrate and on said surface defined by said hole to form a subcomposite;

(d) filling said hole with a filler composition;

(e) etching said subcomposite to partially remove said electrically conductive layer to thereby reduce the thickness of said electrically conductive layer;

(f) removing residual amounts of said filler composition on said subcomposite;

(g) etching said subcomposite to completely remove said electrically conductive layer;

(h) depositing a seed activator on the surface of said subcomposite;

(i) covering said subcomposite with a photoresist and exposing and developing said photoresist to reveal selected areas of said subcomposite; and (j) additively plating electrical circuitry on said selected areas of said subcomposite.

2. The method of claim 1 wherein said dielectric subcomposite is an epoxy.

3. The method of claim 1 wherein the method further comprises attaching a component having a pad to said conductive plating deposited on said filled plated through hole, the diameter of said pad being approximately the same size or smaller than said plated through hole.

4. The method of claim 1 further comprising providing a photosensitive dielectric layer on said subcomposite, and forming circuit lines on said photosensitive dielectric material, and forming vias through said photosensitive dielectric such that said circuit lines communicate with said fine-line circuitry of said subcomposite.

5. A method of producing fine-line circuitry on a printed circuit board having filled plated through holes, said method comprising the steps of:

(a) drilling at least one hole through a dielectric substrate, said hole defining a surface;

(b) depositing electrically conductive plating on the planar surface of said dielectric substrate and on said surface defined by said hole to form a subcomposite;

(c) filling said hole with a filler composition, said composition having nubs protruding beyond said planar surface of said subcomposite;

(d) removing said nubs of said fill composition such that said planar surface of said subcomposite is nearly smooth;

(e) etching said subcomposite to partially reduce the thickness of said electrically conductive metal layer;

(f) scrubbing said nubs of fill composition protruding from said subcomposite;

(g) etching said subcomposite to completely remove said electrically conductive metal layer of said subcomposite;

(h) depositing a seed activator on said subcomposite;

(i) covering said subcomposite with a photoresist coating and exposing and developing said coating to reveal selected areas of the said subcomposite;

(j) depositing conductive plating on said exposed areas of subcomposite to form fine-line circuitry; and (k) stripping said photoresist.

* * * * *